United States Patent
Miranda

(10) Patent No.: US 8,423,730 B2
(45) Date of Patent: Apr. 16, 2013

(54) METHOD AND APPARATUS FOR SUPPORTING DIVERSE MEMORY ACCESS SCHEMES

(75) Inventor: Maria I. Miranda, Carlsbad, CA (US)

(73) Assignee: Qualcomm Innovation Center, Inc., San Diego, CA (US)

( * ) Notice: Subject to any disclaimer, the term of this patent is extended or adjusted under 35 U.S.C. 154(b) by 478 days.

(21) Appl. No.: 12/844,226

(22) Filed: Jul. 27, 2010

(65) Prior Publication Data
US 2012/0030691 A1 Feb. 2, 2012

(51) Int. Cl.
*G06F 12/00* (2006.01)
*G06F 13/00* (2006.01)

(52) U.S. Cl.
USPC .......... 711/159; 711/103; 711/154; 711/206; 711/E12.001; 711/E12.008

(58) Field of Classification Search .................. 711/103, 711/154, 156, 159, 206, E12.001, E12.008
See application file for complete search history.

(56) References Cited

U.S. PATENT DOCUMENTS
2010/0262764 A1* 10/2010 Liu et al. ...................... 711/103

* cited by examiner

*Primary Examiner* — Midys Rojas
(74) *Attorney, Agent, or Firm* — Neugeboren O'Dowd PC

(57) ABSTRACT

Methods and apparatus for supporting diverse memory access schemes are disclosed. In one embodiment, a mobile computing device includes program code that accesses memory according to a first bad block management scheme and program code that accesses memory according to a second bad block management scheme, which is different than the first bad block memory scheme. In addition, a memory component includes data that is partitioned according to both the first bad block management scheme and the second bad block management scheme so as to enable both the code that accesses memory according to a first bad block management scheme and the code that accesses memory according to a second bad block management scheme to utilize the memory component.

22 Claims, 4 Drawing Sheets

METHOD AND APPARATUS FOR SUPPORTING DIVERSE MEMORY ACCESS SCHEMES

FIELD OF THE INVENTION

The present invention relates to computing devices. In particular, but not by way of limitation, the present invention relates to apparatus and methods for memory management in computing devices.

BACKGROUND OF THE INVENTION

Nonvolatile memory (for nonvolatile data) is available in many forms including NOR and NAND memory. With respect to NOR memory, all memory locations are guaranteed to be good, and in contrast, NAND memory is prone to have bad blocks. NAND memory, however, is less expensive than NOR memory, and as a consequence, techniques developed to handle the bad blocks that are inherent in NAND memory so that the less expensive NAND memory may be utilized.

It is known that NAND memory comes from suppliers with bad blocks, but a standard was established that a maximum of 2% of the blocks in the memory could be bad blocks. To handle the presence of these bad blocks, two methods arose to deal with the bad blocks: 1) the skip block method; and 2) the replace block method.

In the skip block method, when a bad block of memory (e.g., 128K bytes) is encountered, the bad block is skipped. And anytime data is being written to, or read from, memory, the memory is checked to make sure that the block is not bad before writing to, or reading from, the block of memory. When a bad block is encountered, the bad block is skipped, and the next block of data is accessed.

In the replace block method, space is reserved in the memory to accommodate data that would ordinarily be stored in the bad blocks, and typically a bad block management layer, which may be part of an abstraction of a low-level driver for the memory, checks the memory so that whenever a bad block is encountered, the bad block management layer remaps the data that is being stored to the portion of the memory that is reserved.

The skip block and replace block methods are used today in disparate devices, and operating systems (or other clients accessing the memory) are designed to access memory in a manner that is consistent with the way that data is stored in memory. In other words, software in devices is designed so that the content of memory is either organized according to the skip block or the replace block management approaches. So, software that is designed to directly access (e.g., via a low-level driver) memory using bad block management, without using a separate abstraction layer, can not be utilized in connection with file systems that operate according to the replace block management approach.

As a consequence, suppliers that want to partner with entities using a different bad block management approach are, at the very least, inconvenienced because they must either change the scheme utilized by their software to accommodate a third party's different bad block management approach, or find an alternative partner that operates in the same manner as their software. Accordingly, current bad block management schemes are not always able to interact will most certainly not be satisfactory in the future.

SUMMARY OF THE INVENTION

Illustrative embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

One embodiment of the invention may be characterized as a mobile computing device that includes program code that accesses memory according to a first bad block management scheme and program code that accesses memory according to a second bad block management scheme, which is different than the first bad block memory scheme. The computing device in this embodiment also includes a memory component that is partitioned according to both the first bad block management scheme and the second bad block management scheme so as to enable both the code that accesses memory according to the first bad block management scheme and the code that accesses memory according to the second bad block management scheme to utilize the memory component.

Another embodiment of the invention may be characterized as a method for programming nonvolatile memory of a mobile computing device. The method in this embodiment comprises receiving the nonvolatile memory, writing program code into a first portion of a memory of the device according to a first bad block management scheme, and writing program code into another portion of the memory of the device according to a second bad block management scheme.

Yet another embodiment of the invention may be characterized as a mobile computing apparatus. The apparatus in this embodiment includes means for storing program code in both a skip-block management format and a replace-block management format and means for executing the program code stored in both the bad block management format and the replace block management format. In addition, the apparatus includes means for accessing the program code that resides in the means for storing in the skip-block management format and the replace-block management format.

And another embodiment of the invention may be characterized as a non-transitory, tangible computer readable storage medium, encoded with processor readable instructions to perform a method for accessing nonvolatile memory of a mobile computing device. The method includes accessing the nonvolatile memory of the mobile computing device using a first bad block management scheme to execute program code stored in the nonvolatile memory according to the first bad block management scheme and accessing the nonvolatile memory of the mobile computing device using a second bad block management scheme to execute program code stored in the nonvolatile memory according to the second bad block management scheme.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings where like or similar elements are designated with identical reference numerals throughout the several views and wherein:

DETAILED DESCRIPTION

Figure 1:
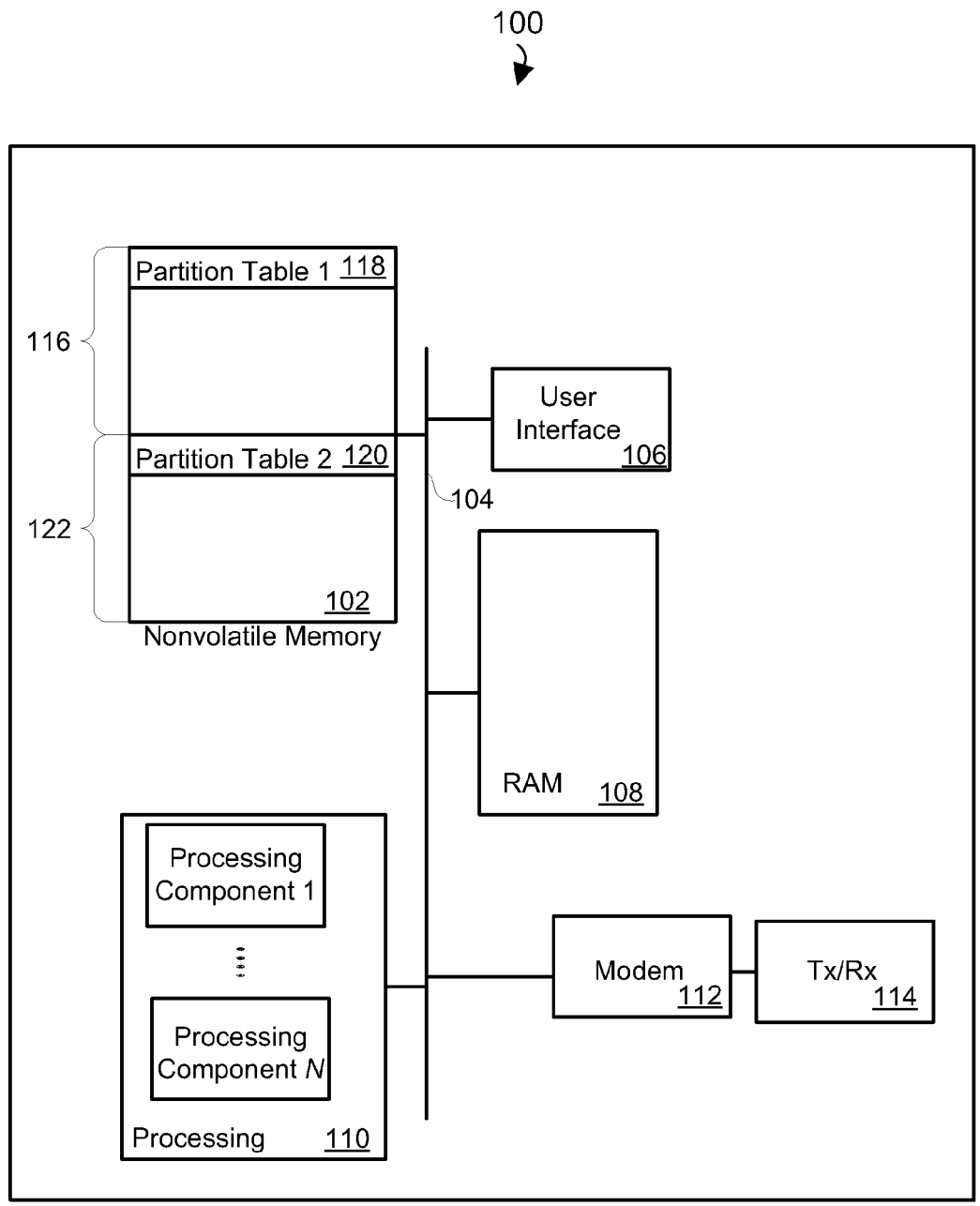
FIG. 1 illustrates a block diagram depicting physical components of an exemplary embodiment of the present invention.

Referring first to FIG. 1, shown is a block diagram depicting physical components of an exemplary embodiment of a mobile computing device 100. As shown, nonvolatile memory 102 is coupled to a bus 104 that is also coupled to a user interface 106, random access memory ("RAM") 108, a processing portion (which includes N processing components) 110, and a communication chain that includes a modem 112 and radio components 114. The nonvolatile memory 102 in this embodiment includes a first portion 116, which includes a first partition table 118 and a second portion 122, which includes a second partition table 120. Although the components depicted in FIG. 1 represent physical components of the mobile computing device 100, it is not intended to be a hardware diagram; thus many of the components depicted in FIG. 1 may be realized by common constructs or distributed among additional physical components.

In general, the nonvolatile memory 102 functions to store (e.g., persistently store) executable code (e.g., bootloader code, modem software, operating system code, file system code, and applications) and data (e.g., user data and media files). In many implementations the nonvolatile memory 102 is realized by flash memory (e.g., NAND or ONENAND™ memory), but it is certainly contemplated that other memory types may be utilized as well. Although it is possible to execute the code from the nonvolatile memory 102, the executable code in the nonvolatile memory 102 is typically loaded into RAM 108 and executed by one or more of the N processing components in the processing portion 110. For example, the N processing components may include a video processor, modem processor, DSP, GPU, and other processing components.

Unlike prior implementations, the nonvolatile memory 102 in this embodiment is adapted to include program code that is stored in the first portion 116 according to a first bad block management scheme, and program code that is stored in the second portion 122 according to a second bad block management scheme. As a consequence, the exemplary mobile computing device 100 may take advantage of available program code that is designed to operate in accord with either bad block management schemes. This enables existing program code that utilizes either of the two bad block management schemes to be utilized without having to undergo substantial redesign of the program code.

Figure 2:
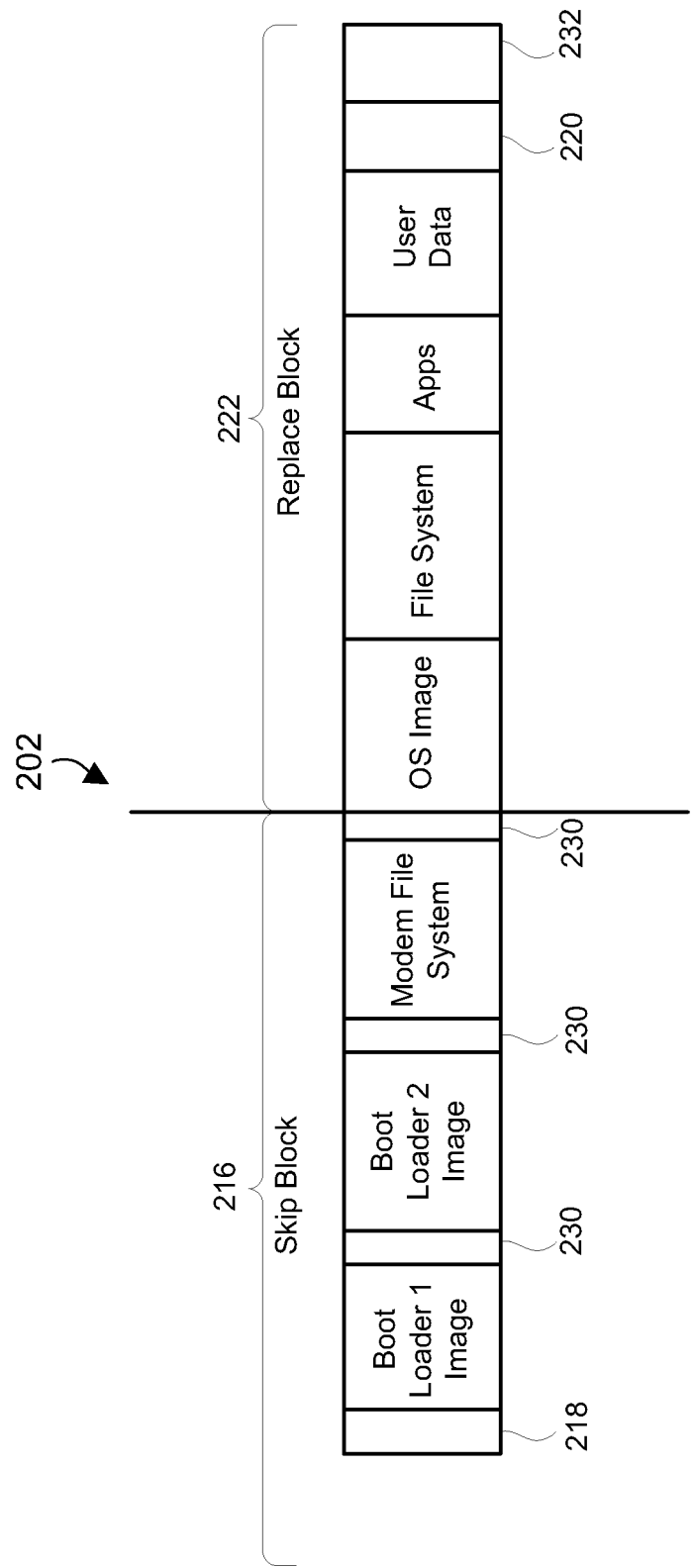
FIG. 2 is a diagram depicting an exemplary partitioning of the nonvolatile memory described with reference to FIG. 1.

Referring to FIG. 2, for example, shown is an exemplary partitioning of a nonvolatile memory 202 (e.g., the nonvolatile memory 102 described with reference to FIG. 1). As shown, bootloader code and modem software that are designed to operate according to a skip-block management scheme may be stored in a first portion 216 of the nonvolatile memory 202, and operating system code, file system code, user data, and applications that are designed to operate according to a replace-block management scheme may be stored in a second portion 222 of the nonvolatile memory 202. It should be recognized that the content of the portions 216, 222 is merely exemplary and the other content may supplant or augment the content depicted in FIG. 2.

As depicted, each portion 216, 222 of the exemplary nonvolatile memory 202 includes a corresponding partition table 218, 220, and the first portion 216 of the nonvolatile memory 202 includes pad portions 230 (e.g., 2% of the memory) to accommodate data that could not be placed in the skipped blocks. The second portion 222 includes a reserved area 232 of memory blocks for the data that is displaced in connection with the replace block management scheme. The first partition table 218 includes pointers to data in the first portion 216 (including the pad portions 230), and the second partition table 220 includes pointers to data in the second portion 222 (including the reserved area 232).

In the embodiment depicted in FIG. 2, the code that resides in the first portion 216 of the memory 202 uses a skip-block management approach for managing bad blocks. When the code is first installed (e.g., using flash tools), the status of each block of the first portion 216 of memory 202 is checked, and if a block is bad, the data is stored in the next good block; thus pad portions 230, which may total 2% of the memory in the first portion 216, are set aside in anticipation of bad memory blocks being encountered.

In contrast, when the code that resides in the second portion 222 is installed, if a block is bad, the code that would have been placed in the bad block is saved to the reserve area 232, and a bad block mapping table is updated to point to the data in the reserve area 232. Although certainly not required, the code in the first portion 216 may be code that conforms to operations of ARM9™ architectures, and the code that resides in the second portion 222 conforms to operations of ARM11™ architectures. For example, the software in the first portion 216 of memory 202 may be QUALCOMM™ software that operates according to ARM9™ architectures, and the software in the second portion 222 of the memory 202 may include real time operating system and file system software, which operate according to ARM11™ architectures.

Figure 3:
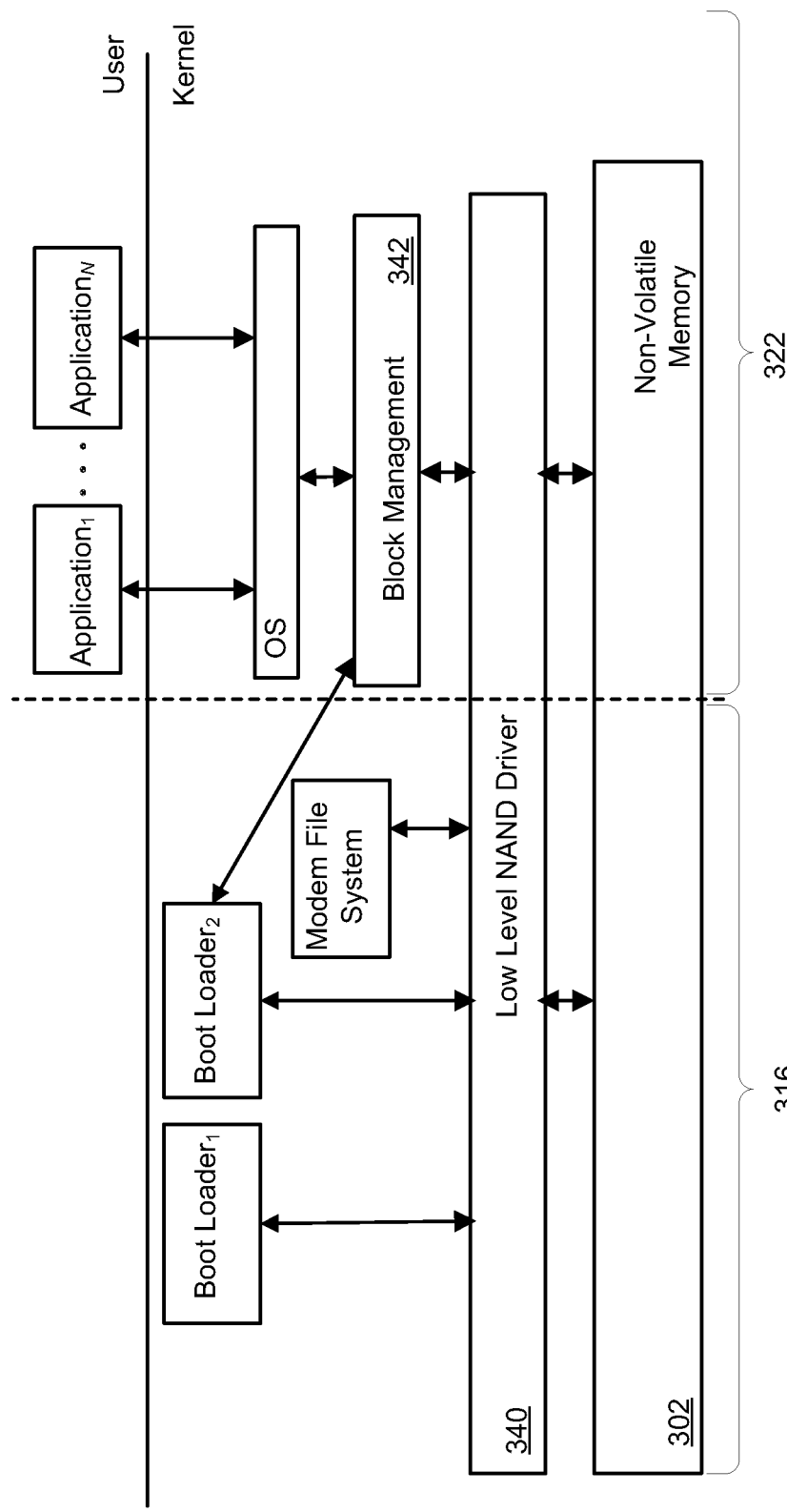
FIG. 3 is a block diagram depicting the system layers corresponding to the software components depicted in FIG. 2.

Referring next to FIG. 3, shown is a block diagram depicting exemplary system layers corresponding to the software components depicted in FIG. 2. As shown, at the kernel level, bootloader$_1$, bootloader$_2$, and modem file system are all configured to operate according to a skip-block management scheme and communicate directly with the nonvolatile memory 302 via its low-level device driver 340. More specifically, the bad block management software associated with bootloader$_1$, bootloader$_2$, and modem file system does not operate as a separate layer, but instead is an integral part of bootloader$_1$, bootloader$_2$, and modem file system. In contrast, applications (operating at the user level) and the operating system communicate with the nonvolatile memory 302 via a block management layer 342, which operates as a separate layer to provide replace-block management access to the memory 302.

As a consequence, existing (e.g., legacy) software for bootloader$_1$, bootloader$_2$, and modem file system (e.g., that conforms to ARM9™ architectures) may be utilized in connection with other software (e.g., that conforms to ARM11™ architectures), without having to be substantially redesigned to operate according to a replace block management approach or being redesigned to utilize the block management layer 342. For example, the operating system may be a real time operating system and the block management layer 342 may be realized by file system software, both of which operate in accord with ARM11™ architectures.

Figure 4:
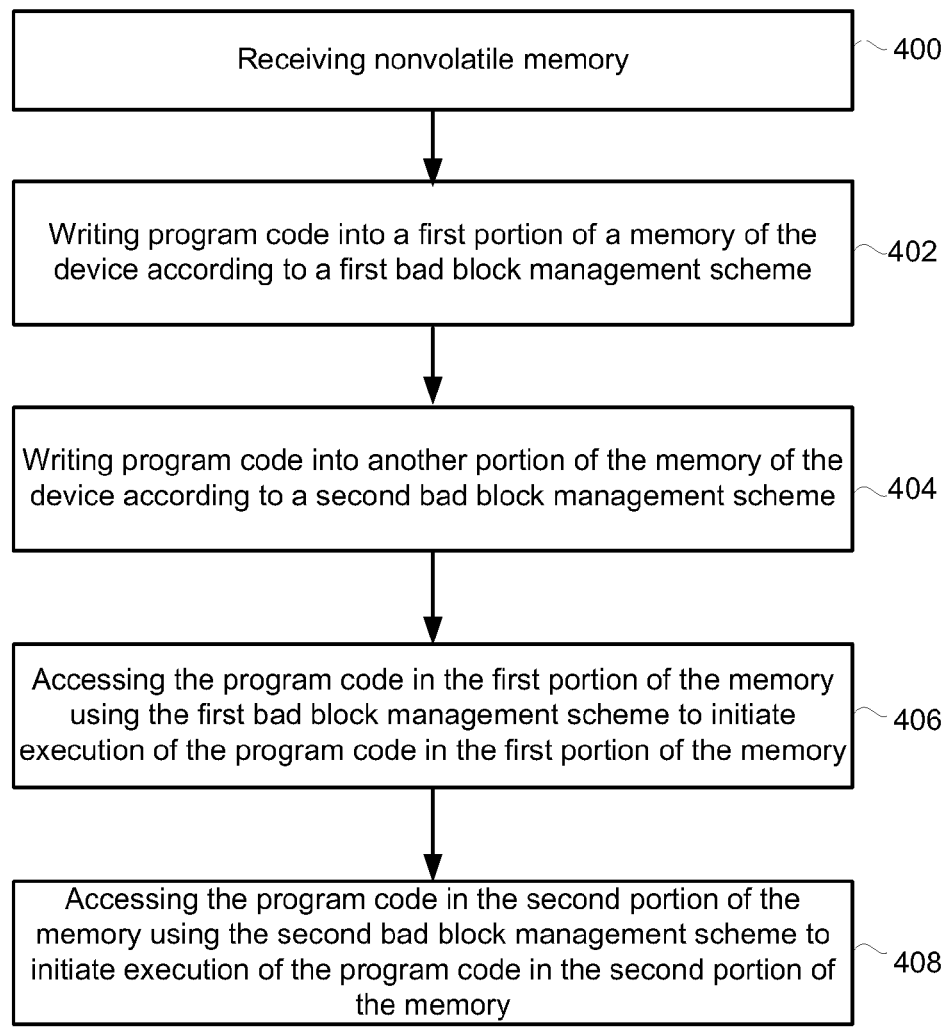
FIG. 4 is a flowchart that depicts a method that may be carried out in connection with the embodiments described with reference to FIGS. 1-3.

Referring next to FIG. 4, it is a flowchart that depicts a method that may be carried out in connection with the embodiments described with reference to FIGS. 1-3. As depicted, when nonvolatile memory is received (Block 400) by an entity (e.g., a mobile device supplier), the nonvolatile memory is first programmed (e.g., using flash tools). In accord with many embodiments, the flash tools are adapted to enable program code to be written into a first portion (e.g., portion 116, 216, 316) of a memory (e.g., memory 102, 202, 302) of the device according to a first bad block management scheme (Block 402), and write program code into a second portion (e.g., portion 122, 222, 322) according to a second bad block management scheme (Block 404).

As a consequence, once the memory is programmed, the program code in the first portion of the memory is accessed using the first bad block management scheme to initiate execution of the program code (e.g., bootloader$_1$, bootloader$_2$, and modem software) in the first portion of the memory (Block 406), and the program code in the second portion of the memory is accessed using the second bad block management scheme to initiate execution of the program code (e.g., operating system, file system, and applications) in the second portion of the memory (Block 408).

In many modes of operation, when the mobile communication device 100 initially starts, the processing portion 110 executes a primary boot loader (e.g., stored in boot ROM (not shown)), which loads bootloader$_1$, which loads bootloader$_2$ in accord with the skip-block management scheme. As depicted, bootloader$_2$ will load the modem image and initiate the modem system file by directly accessing the memory (e.g., via the low level driver 340) in accord with the skip-block management scheme. But in addition, bootloader$_2$ is also configured to utilize the API of a file system (e.g., an API of block management layer 342) to initiate the loading of the OS image.

In conclusion, embodiments of the present invention enable a mobile communicating device to support software that operates according to diverse bad block management schemes. And as a consequence, the mobile computing device may be brought to market in a reduced amount of time because legacy software (e.g., modem software) need not be substantially redesigned to operate according to the bad block management scheme supported by other software (e.g., operating system and applications) that run on the device. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A mobile computing device, comprising:
   program code that accesses memory according to a first bad block management scheme;
   program code that accesses memory according to a second bad block management scheme, the second bad block management scheme being different than the first bad block management scheme wherein the program code that accesses memory according to the first bad block management scheme includes bootloader code and the program code that accesses memory according to the second bad block management scheme includes operating system code; and
   a memory component including data partitioned according to both the first bad block management scheme and the second bad block management scheme so as to enable both the code that accesses memory according to the first bad block management scheme and the code that accesses memory according to the second bad block management scheme to utilize the memory component.

2. The mobile computing device of claim 1, wherein the bootloader code is adapted, so that when it is executed, to utilize an API call of an abstraction layer that is generally available to other code so as to initiate an execution of the operating system code.

3. The mobile computing device of claim 1, wherein the memory component is a single contiguous memory component including a first partition table with pointers to data stored according to the first bad block management scheme and a second partition table with pointers to data that is stored according to the second bad block management scheme.

4. The mobile computing device of claim 3, wherein the first bad block management scheme is a skip-block management scheme and the first partition table includes pointers to data stored according to the skip-block management scheme, and the second bad block management scheme is a replace-block management scheme and the second partition table includes pointers to data stored according to the replace-block management scheme.

5. A method for programming nonvolatile memory of a mobile computing device, the method comprising:
   receiving the nonvolatile memory;
   writing program code, which includes bootloader code, into a first portion of the nonvolatile memory of the device according to a first bad block management scheme; and
   writing program code, which includes operating system code, into another portion of the nonvolatile memory of the device according to a second bad block management scheme.

6. The method of claim 5, wherein the program code that is written to the first portion of the nonvolatile memory includes program code that is adapted to access the nonvolatile memory using only the first bad block management scheme and the program code that is written to the second portion of the nonvolatile memory includes program code that is adapted to access the nonvolatile memory using only the second bad block management scheme.

7. The method of claim 6, wherein the program code that is adapted to access the nonvolatile memory using only the first bad block management scheme is adapted to directly access the memory via a low level driver for the memory.

8. The method of claim 6, wherein the program code that is written to the second portion of the memory includes program code to create a block management layer when executed, and the block management layer accesses the second portion of the memory using the second bad block management scheme and provides an abstraction for clients to access the memory via the block management layer.

9. The method of claim 8, wherein the program code that is written to the first portion of the nonvolatile memory includes program code that is adapted to directly access the nonvolatile memory using the first bad block management scheme and access the second portion of the memory, via the block management layer, using the second bad block management scheme.

10. The method of claim 9, wherein the first bad block management scheme is a skip-block management scheme and the second bad block management scheme is a replace-block management scheme.

11. A mobile computing apparatus, the apparatus comprising:
   means for storing program code that includes bootloader code in a skip-block management format;
   means for storing program code that includes operating system code in a replace block management format;

means for executing the program code stored in the skip-block management format and means for executing the program code stored in the replace-block management format; and means for accessing the bootloader code in the skip-block management format and means for accessing the operating system code in the replace-block management format.

12. The mobile computing device of claim 11, wherein the bootloader code directly accesses the means for storing via a low level driver for the memory.

13. The mobile computing device of claim 11, wherein the means for accessing the program code includes code that is adapted, when executed, to create a block management layer that provides an abstraction of the means for storing code that includes operating system code to enable disparate clients that are executed by the means for executing to access the means for storing code that includes operating system code.

14. The mobile computing device of claim 13, wherein at least a portion of the bootloader code is adapted to directly access the code in the skip-block management format and access, via the block management layer, the code in the replace-block management format.

15. The mobile computing device of claim 11, wherein the means for storing program code that includes bootloader code includes a first partition table for locating the program code stored according to the skip-block management format and the means for storing program code that includes operating system code includes a second partition table for locating the program code stored according to the replace-block management format.

16. A non-transitory, tangible computer readable storage medium, encoded with processor readable instructions to perform a method for accessing nonvolatile memory of a mobile computing device, the method comprising:

accessing the nonvolatile memory of the mobile computing device using a first bad block management scheme to execute bootloader code stored in the nonvolatile memory according to the first bad block management scheme; and accessing the nonvolatile memory of the mobile computing device using a second bad block management scheme to execute operating system code stored in the nonvolatile memory according to the second bad block management scheme.

17. The non-transitory, tangible computer readable storage medium of claim 16, wherein accessing the nonvolatile memory of the mobile computing device using a first bad block management scheme includes directly accessing the nonvolatile memory of the mobile computing device.

18. The non-transitory, tangible computer readable storage medium of claim 17, wherein directly accessing the nonvolatile memory of the mobile computing device includes directly accessing the nonvolatile memory during a boot load sequence.

19. The non-transitory, tangible computer readable storage medium of claim 16, wherein accessing the nonvolatile memory of the mobile computing device using a second bad block management scheme includes accessing the nonvolatile memory via a block management layer.

20. The non-transitory, tangible computer readable storage medium of claim 19, wherein accessing the nonvolatile memory via a block management layer includes accessing the nonvolatile memory via the block management layer using code that executes after being accessed from the nonvolatile memory using the first bad block management scheme.

21. The non-transitory, tangible computer readable storage medium of claim 20, wherein the code that executes after being accessed from the nonvolatile memory is the bootloader code that initiates, via the block management layer, execution of operating system code that uses the second bad block management scheme.

22. The non-transitory, tangible computer readable storage medium of claim 21, wherein the bootloader code directly accesses a low level driver of the memory, using the first bad block management scheme to initiate execution of modem software.

* * * * *